US006330704B1

(12) United States Patent
Ljung et al.

(10) Patent No.: US 6,330,704 B1
(45) Date of Patent: Dec. 11, 2001

(54) METHOD AND APPARATUS FOR THREE DIMENSIONAL INTERCONNECT ANALYSIS

(75) Inventors: Per Ljung; Martin Bachtold, both of San Francisco, CA (US)

(73) Assignee: Coyote Systems, Inc., San Francisco, CA (US)

(*) Notice: Subject to any disclaimer, the term of this patent is extended or adjusted under 35 U.S.C. 154(b) by 0 days.

(21) Appl. No.: 09/499,965

(22) Filed: Feb. 8, 2000

Related U.S. Application Data
(60) Provisional application No. 60/119,299, filed on Feb. 9, 1999.

(51) Int. Cl.[7] .............................. G06F 9/455; G06F 17/50
(52) U.S. Cl. ......................................... 716/5; 716/4; 716/6
(58) Field of Search .................................. 716/1, 2, 4, 5, 716/6, 7; 438/14, 17

(56) References Cited

U.S. PATENT DOCUMENTS

| 5,295,088 |   | 3/1994  | Hartog et al. ........................ 364/578 |
|-----------|---|---------|------------------------------------------------|
| 5,452,224 |   | 9/1995  | Smith et al. ........................ 364/488  |
| 5,555,506 | * | 9/1996  | Petschauer et al. .                            |
| 5,610,833 |   | 3/1997  | Chang et al. ........................ 364/491  |
| 5,706,206 |   | 1/1998  | Hammer et al. ...................... 364/489   |
| 5,706,477 | * | 1/1998  | Goto .                                         |
| 5,734,583 |   | 3/1998  | Shou et al. ........................... 364/491 |
| 5,751,591 |   | 5/1998  | Asada et al. ........................ 364/488  |
| 5,761,080 |   | 6/1998  | DeCamp et al. ...................... 364/490   |
| 5,838,582 |   | 11/1998 | Mehrotra et al. .................... 364/490   |
| 5,896,300 | * | 4/1999  | Raghavan et al. .                              |
| 6,061,508 | * | 5/2000  | Mehrotra et al. .                              |
| 6,128,768 | * | 10/2000 | Ho .                                           |
| 6,175,947 | * | 1/2001  | Ponnapalli et al. .                            |
| 6,253,359 | * | 6/2001  | Cano et al. .                                  |

OTHER PUBLICATIONS

Bachtold et al., "An Error Indicator and Automatic Adaptive Meshing for Electrostatic Boundary Element Simulations", IEEE Transactions on Computer–Aided Design of Integrated Circuits and Systems, vol. 16, No., 12, Dec. 1997, pp. 1439–1446.*

Bachtold et al., "Automated Extraction of Capacitances and Electrostatic Forces in MEMS and ULSI Interconnects from the Mask Layout", 1997 Electron Devices Meeting, pp. 129–132.*

Devgan, A., "Efficient Coupled Noise Estimation for On–Chip Interconnects", IEEE (1997).

Chen, Pinhong and Kurt Keutzer, "Towards True Crosstalk Noise Analysis", IEEE (1999).

Kuhlmann, et al., "Efficient Crosstalk Estimation", IEEE (1999).

(List continued on next page.)

*Primary Examiner*—Charles Bowers
*Assistant Examiner*—Evan Pert
(74) *Attorney, Agent, or Firm*—Townsend and Townsend and Crew LLP (57) ABSTRACT

A method for calculating the parasitic capacitance and resistance in a semiconductor device is disclosed. According to the preferred embodiment, a layout file containing the shapes of semiconductor interconnects and a technology file describing the fabrication steps are used to generate a 3D model of the structures. The surfaces of the model are discretized and a double boundary integral equation is solved to compute the field allowing various interconnect parameters to be computed, including resistance, self-capacitance, cross-capacitance, and current density. Further, the preferred embodiment discloses how numerical analysis can be efficiently performed on typical large interconnect and substrate structures.

12 Claims, 10 Drawing Sheets

OTHER PUBLICATIONS

Morton, et al., "Optimal Spacing for Managing Cross–talk Induced Noise and Delay in Resistive VLSI Interconnections", (Apr. 3, 2000).

Hunter, Prof. Peter and Dr. Andrew Pullan, FEM/BEM Notes (Mar. 4, 1997).

Chang, "Analytical IC Metal–Line Capacitance Formulas", IEEE Transactions on Microwave Theory and Techniques, (Sep. 1976), pp. 608–611.

Ruehli, et al., Efficient Capacitance Calculations for Three–Dimensional Multiconductor Systems, IEEE Transactions on Microwave Theory and Techniques, vol. 21, No. 2, (Feb. 1973), pp. 76–82.

Sakurai, T. and K. Tamaru, "Simple Formulas for Two and Three Dimensional Capacitanes", IEEE Trans. Electron Devices, vol. ED–30, No. 2, pp. 183–185, 1983.

McCormick, "EXCL: A Circuit Extractor for IC Designs", IEEE (1984), pp. 616–623.

van der Meijs, N. P. and A. J. van Genderen, "An Efficient Finite Element Method for Submicron IC Capacitance Extraction", 26th ACM/IEEE Design Automation Conference, Paper 40.2, (1989), pp. 678–681.

Janak, James F. and David D. Ling et al., "C3DSTAR: A3D Wiring Capacitance Calculator", ICCAD–89 Digest, (Nov. 1989), pp. 530–533.

Nabors, et al., "Fast Capacitance Extraction of General Three–Dimensional Structures", IEEE Transactions on Microwave Theory and Techniques, vol. 40, No. 7, (1992), pp. 1496–1506.

* cited by examiner

first decomposition level 703
cluster 706
surfaces 110

Figure 16b.

second decomposition level 704
parent-cluster 707
cluster 706
child-cluster 708

Figure 16c.

third decomposition level 705

METHOD AND APPARATUS FOR THREE DIMENSIONAL INTERCONNECT ANALYSIS

CROSS REFERENCE TO RELATED APPLICATIONS

This application is a non-provisional application of U.S. provisional patent application entitled "METHOD AND APPARATUS FOR THREE DIMENSIONAL INTERCONNECT ANALYSIS," U.S. Ser. No. 60/119,299, filed Feb. 9, 1999, having Per Ljung and Martin Bachtold named as co-inventors. The 60/119,299 application is hereby incorporated by reference in its entirety.

STATEMENT REGARDING GOVERNMENT RIGHTS

This invention was made with Government support under Contract F30602-96-2-0305 awarded by the Air Force. The Government has certain rights in this invention.

BACKGROUND OF THE INVENTION

1. Field of the Invention

This invention relates to a method for deriving the parasitic parameters of conductors. More specifically, the invention relates to a method for calculating the capacitance between conductors and resistance in conductors in an integrated circuit.

2. Description of the Related Art

As the feature size of advanced integrated circuits continues to decrease and transistor switching times become ever shorter, on-chip signal delay is increasingly dominated by the RC delay associated with the signal lines. In order for circuits to produce meaningful and reliable results, the circuit models used must include accurate values for the capacitances and resistances of the signal lines. The complex dielectric structures present in advanced chip and package technologies can have a substantial effect on the signal line capacitance values. The only practical method for obtaining accurate capacitance values for such geometries is detailed numerical solution.

In the electrical modeling of packages it has long been recognized that the capacitance of signal lines plays an important role in determining signal propagation delays. For this reason, it has been standard practice to carry out detailed numerical calculations of the circuit parameters (e.g. R, L, C) of signal lines. These computed circuit parameters for signal lines and circuit models for the drivers and receivers are then used to predict such properties as signal delay and crosstalk for boards and modules.

Until recently, the situation was quite different for the analysis of signal delay in integrated circuits on a single chip. In the past, signal delay was dominated by the switching time associated with the individual transistors in the circuit, and only for a select few signal lines was an accurate circuit model needed. One would typically use a crude estimate of the capacitance per unit length of a critical signal line, and omit all coupling-capacitances and the self-capacitances of other wires. The capacitances per unit length of the few important signal lines were often obtained from simple area-perimeter formulas.

With recent advances in chip technology, the switching time of transistors has become exceedingly small. As a result, the performance of on-chip circuits has become increasingly limited by the RC delay associated with signal lines. Each new decrease in feature size increases the portion of signal delay due to the signal lines. It is thus becoming more critical that accurate capacitances for signal lines be included in equivalent circuit models of on-chip circuits.

Others have attempted to determine capacitances and resistances related to circuit signal lines. For example, the following references are known:

| | | |
|---|---|---|
| 1. | 5,295,088 . . . March 1994 | Hartog, et al. |
| 2. | 5,452,224 . . . Sept 1995 | Smith, et al. |
| 3. | 5,610,833 . . . March 1997 | Chang, et al. |
| 4. | 5,706,206 . . . Jan 1998 | Hammer, et al. |
| 5. | 5,734,583 . . . March 1998 | Shou, et al. |
| 6. | 5,751,591 . . . May 1998 | Asada, et al. |
| 7. | 5,761,080 . . . June 1998 | DeCamp, et al. |
| 8. | 5,838,582 . . . Nov 1998 | Mehrotra, et al. |

9. Chang, "Analytical IC Metal-Line Capacitance Formulas", IEEE Transactions on Microwave Theory and Techniques, (September 1976), pp. 608–611.

10. Ruehli, et al., "Efficient Capacitance Calculations for Three-Dimensional Multiconductor Systems", IEEE Transactions on Microwave Theory and Techniques, Vol. 21, No. 2, (February 1973), pp. 76–82.

11. Sakurai, T. and K. Tamaru, "Simple Formulas for Two and Three Dimensional Capacitances", IEEE Trans. Electron Devices, Vol. ED-30, No. 2, pp. 183–185, 1983.

12. McCormick, "EXCL: A Circuit Extractor for IC Designs", IEEE (1984), pp. 616–623.

13. van der Meijs, N. P. and A. J. van Genderen, "An Efficient Finite Element Method for Submicron IC Capacitance Extraction", 26th ACM/IEEE Design Automation Conference, Paper 40.2, (1989), pp. 678–681.

14. Janak, James F. and David D. Ling et al., "C3DSTAR: A 3D Wiring Capacitance Calculator", ICCAD-89 Digest, (November 1989), pp. 530–533.

15. Nabors, et al., "Fast Capacitance Extraction of General Three-Dimensional Structures", IEEE Transactions on Microwave Theory and Techniques, Vol. 40, No. 7, (1992), pp. 1496–1506.

Several different methods have been used to obtain capacitances and resistances for signal lines. These include exact closed-form solution, approximate formulas (such as area-perimeter formulas), and detailed numerical solution. Closed-form exact solutions can be obtained for highly-symmetric 2D and 3D geometries through the use of separation of variables. Some 2D problems can be solved by conformal mapping (e.g. [9]). These exact analytic methods are elegant and produce closed-form expressions for the capacitances. However, they are severely limited in the variety of geometries that can be analyzed, and are incapable of handling the geometries typical of advanced chips and packages.

Simple approximate formulas are often used in circuit extraction programs.

Some approximate formulas, such as area-perimeter formulas, arc based on drawing a rough analogy between the actual geometric configuration and some idealized geometry for which one can find an exact solution. Such uncontrolled approximations can be verified only by hardware measurement and/or detailed numerical computation. Other simple formulas are obtained by fitting curves to capacitance values computed numerically (e.g. [1], [2], [3], [4], [5], [7], [8], [11], [12]). Approximate formulas based on anything other than detailed numerical solution or hardware measurement are incapable of producing sufficiently accurate capacitance values for advanced chips and packages.

Figure 1:
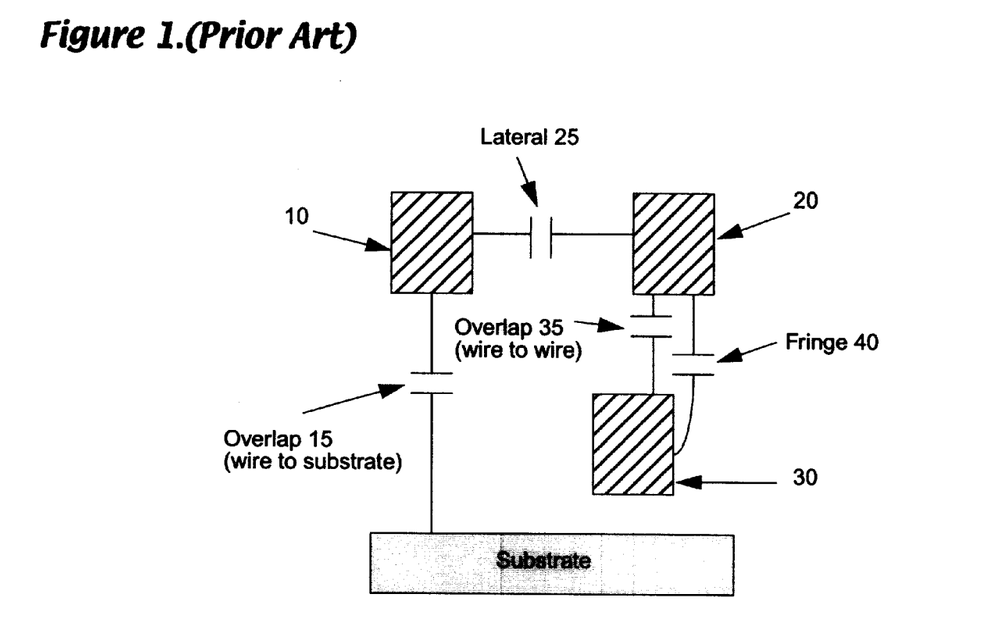
FIG. 1 shows a prior art 2D conceptual drawing of self and cross-capacitance components of conductor nets in cross-section.

FIG. 1 depicts a prior art 2D representation of the self-capacitance and cross-capacitance between different conductor nets 10, 20, 30. A conductor net can be thought of as a set of electrically connected conductors. As used herein, conductor net and interconnect are substantially synonamous. A driven conductor net with specified non-zero potential is referred to as the active net. Conductor nets which are near to the active net with specified zero potential are referred to as victim nets. The self-capacitance of the active net and the cross-capacitance between the active net and victim nets are used to calculate the delay of the active net and the coupling between the active and victim nets. The self-capacitance and cross-capacitances are decomposed into contributions due to overlap 15, 35, lateral 25, and fringe 40 capacitance effects. All capacitance effects (including overlap, lateral and fringe) have components due to wire to substrate and wire to wire capacitance. Though overlap, lateral and fringe capacitances are often treated separately, such distinctions are artificial; capacitance is really a single, three-dimensional electromagnetic problem. How closely a particular parasitic extraction algorithm models this three-dimensional physical reality is often characterized as "two-dimensional" (2D) or "three-dimensional" (3D). The calculation of any capacitive value is always three-dimensional (requiring width, length and thickness of the conductors as well as distance between them), but the terms "2D", "2.5D" and "3D" refer to how an algorithm attacks the problem.

The 2D and 2.5D algorithms typically superimpose the numerical field solutions of simple patterns to obtain a capacitance and resistance estimate for an actual conductor net. However because the conductor net geometry is dissimilar to the patterns, the pattern fields cannot be superimposed, which introduces a nonlinear geometrical error. As a result, 2D and 2.5D algorithms that use simple patterns are inherently inaccurate. Further, irregular conductor net geometries are not identified as precharacterized patterns. The capacitance contribution due to these unidentified geometries can be discarded, interpolated between nearby patterns, or a numerical solver is used to compute a solution. All of these faults show that 2D and 2.5D algorithms are not suitable to extract high accuracy capacitance and resistance models.

Instead numerical computation of capacitance and resistance is a flexible and fast alternative. Two basic methods exist for the numerical computation of capacitance and resistance:

1) methods that solve for the potential throughout the space (i.e. finite element and finite difference methods based on the differential form of the equations of electrodynamics) (e.g. [13]) and
2) methods that solve for the charge density or current density (i.e. the boundary integral equation method based on the integral form of the equations of electrodynamics) (e.g. [10], [14], [15]).

Each numerical method has advantages and disadvantages. The finite-element and finite-difference methods have the disadvantage that they must fill all space with a 3D volume discretization or grid. Typically, finite-element methods require an extremely large number of unknowns to obtain acceptable accuracy. It is not uncommon for a finite-element solution to require many hundreds of thousands of unknowns. As a result, using the finite-element method and finite-difference method are not feasible for large models. Moreover, the potential field must be numerically differentiated (an error producing process) in order to obtain the capacitance and resistance. The advantages of the finite-element and finite-difference methods are that the matrix of coefficients of the resulting linear system is extremely sparse, and the few elements that are non-zero are trivial to compute. In addition, the finite-element and finite-difference methods can treat complex dielectric geometries in a natural and straightforward manner.

The boundary integral equation method has the advantage that the unknown for which one solves is the charge density (or current density). As a result, no numerical differentiation is required in order to obtain the capacitance or resistance. Moreover, the charge density resides only at the surfaces of conductors and at dielectric boundaries. One therefore need not discretize all space, but rather only the surfaces themselves. The number of unknowns required is considerably smaller than in the finite-element and finite-difference methods. To support multiple dielectrics with the boundary integral equation method, it is necessary to enforce conservation of flux and equal potential across the dielectric boundaries. Simulating multiple dielectrics is not straightforward with boundary integral methods utilizing single integrals since these only solve for the unknown charge density and not the required potential on the dielectric boundaries. Simulating multiple dielectrics is straightforward with boundary integral methods utilizing double integrals since they simultaneously solve both the unknown potential and charge density on the discretized surfaces. The disadvantage of the boundary integral equation method is that the matrix of coefficients of the linear system is dense, and each individual matrix element is costly to evaluate. Since the matrix is dense, it has computational scaling of $O(N^2)$ where N is the number of unknowns. As a result, using the boundary integral equation method is not feasible for large models.

SUMMARY OF THE INVENTION

The present invention reveals a method and apparatus to obtain self-capacitance, cross-capacitances and resistances for interconnects and substrates using a boundary integral method, also known as the boundary element method (BEM). In contrast to previous boundary integral methods using a single integral (e.g. [10], [14], [15]) which solve for unknown charge density on the discretized surfaces, the present method uses double boundary integrals to solve for both the unknown potential and the unknown charge density (or current density) on the discretized surfaces. These double boundary integrals result in two matrices of coefficients. By applying known state and known flux boundary conditions, a linear system is obtained as earlier. By enforcing conservation of flux and equal potential across dielectric boundaries, it is straightforward to support multiple dielectrics. Further, methods are taught which sparsify the two matrices of coefficients reducing the computational scaling to $O(N\log N)$. Further, methods are taught which allow the efficient and accurate calculation of very large interconnect structures.

According to one aspect of the invention, an interconnect analysis system comprises:
 generating a 3D geometric model of conductors from a layout description
 defining conductors into conductor nets
 designating a conductor net as an active net
 designating a plurality of conductor nets as victim nets
 defining interfaces between disparate materials separating said conductor nets discretizing the surfaces of said active net, said victim nets and said interfaces computing a field response between said active net and said victim nets and calculating a plurality of parameters describing the electrical behavior of said conductors from said field response.

The Laplace partial differential equation describes the electrostatic field to be solved to compute capacitance. The state variable is potential and the gradient of the state variable, or flux, is charge density. The Laplace partial differential equation also describes the electric field to be solved to compute resistance in interconnects or substrates. The state variable is potential and the gradient of the state variable, or flux, is current density. A method or apparatus capable of solving generic Laplace partial differential equations can therefore analyze interconnects and substrates by numerically computing capacitance and resistance values.

References [1], [2], [3], [4], [5], [7], [8], [11], and [12] describe approximation methods using interpolation of pre-computed pattern libraries. These methods generate a single capacitance value for a conductor independent of available simulation time, and therefore cannot refine or provide a more accurate solution if desired. Reference [6] uses an integral method to calculate inductance using a volumetric discretization of conductors, which is not the object of the present invention. Reference [9] uses analytical 2D conformal mapping which is not suitable for the 3D structures which are the subject of this invention. Reference [13] describes a finite-element software.

References [10], [14], and [15] describe single integral methods to obtain conductor parameters. References [10], [14], and [15] presuppose known potentials on the model, and therefore only use the gradient integral to calculate the unknown flux or surface charge density to obtain the capacitance. The computational scaling of [10], [14] is $O(N^2)$ since dense matrices are used. Reference [15] teaches a method to reduce the computational scaling to $O(N\log N)$ by sparsifying the gradient matrix.

The present invention is the only method which calculates both the state integral and gradient integral, which allows for straightforward capacitance and resistance calculations with multiple materials. Further, the present invention is the only method which teaches a method to sparsify both the resulting state matrix and the gradient matrix substantially decreasing the required computational resources. Further, the present invention reveals a method of reducing the size of the geometric model which further reduces the computational resources required to solve the unknown values. Further, the present invention is the only method which reveals a method of evaluating the errors due to the discretization of the geometric model and provides a method of increasing the accuracy of the solved unknown values. Further, the present invention is the only method which reveals a method that allows simple local refinement using mixed-order elements.

DETAILED DESCRIPTION OF PREFERRED EMBODIMENT

The preferred embodiment of the present invention will be discussed with reference to the accompanying drawings. In the following description, numerous specific details are set forth in order to provide a thorough understanding of the present invention. It will be obvious, however, to those skilled in the art that the present invention may be practiced without these specific details. In other instances, well-known structures are not shown in detail in order to avoid unnecessarily obscuring the present invention.

Figure 2:
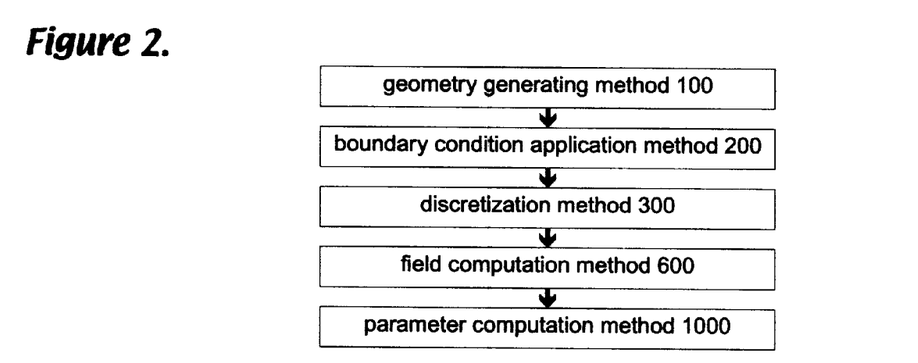
FIG. 2 is a general flow chart of an interconnect analysis system.

FIG. 2 is a block diagram showing a construction of the interconnect analysis method according to the present invention. First a geometry generating method 100 reads an input circuit description and creates a 3D model 109 (shown in FIGS. 3, 12). A conductor net method is thus applied to the model to identify a plurality of electrically connected conductor nets 114 (also shown in FIGS. 3, 12). Next a boundary condition application method 200 applies appropriate Neuman and Dirichlet boundary conditions to the active net 201 and victim nets 202 (shown in FIG. 4). Next a discretization method 300 discretizes the surfaces of 3D model 109 forming surface elements 304 (shown in FIGS. 5, 13, 15). Next a field computation method 600 computes the external field solution 701 between active net 201 and victim nets 202 and computes an internal field solution 801 inside active net 201 (seen in FIGS. 8, 12, 17–19). Finally a parameter computation method 1000 computes parameters describing the interconnect using the previously computed external field solution 701 and internal field solution 801 (shown in FIG. 11). Each of these methods is now described in further detail.

Figure 3:
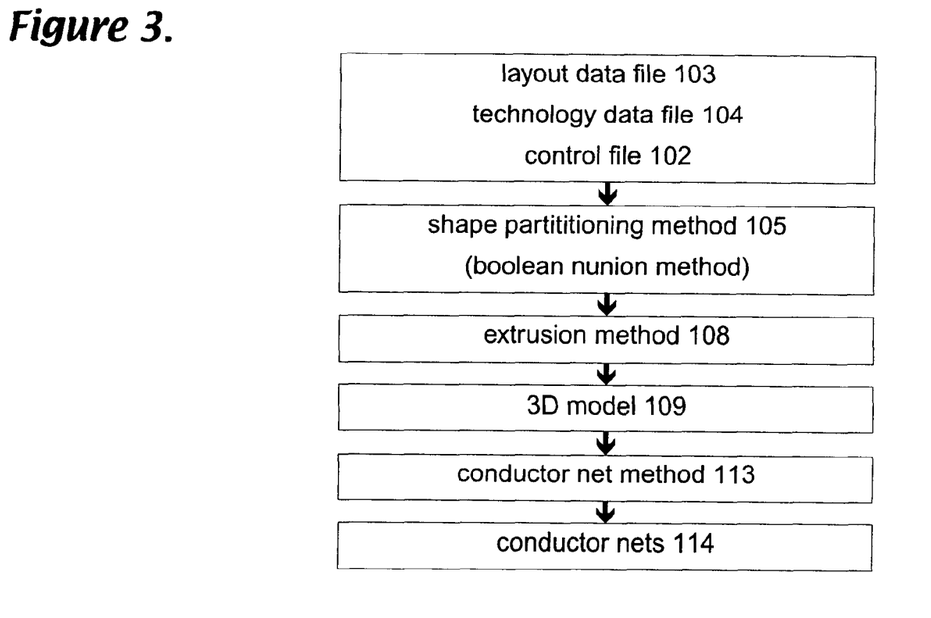
FIG. 3 is a more detailed flow chart of a geometry generating method as identified in FIG. 2.

FIG. 3 shows steps comprising the geometry generating method 100. Circuit geometrical information, namely the shape of the device, is provided from a layout data file 103. The layout data file 103 is typically created by the design process. It is the unique layout file that represents all or part of a semiconductor device that will have its parasitic parameters computed. The parameters in layout data file 103 include the location of each point on the shapes and the layer each shape is on.

The technology data file 104 describes the process parameters for the fabrication process. Thus, physical material parameters such as dielectric constants and metal resistivity are provided by technology data file 104. Typically a different technology data file would exist for each type of fabrication process, such as the various CMOS and bipolar processes. The use of technology data file 104 thus allows the preferred method to be easily used on multiple types of fabrication processes by simply switching files. The technology data file 104 can also include such parameters as metal layer thicknesses and the distances between layers. The tolerances for these parameters can also be included, and thus the file could also include nominal, best and/or worst case dimensions.

The parameters stored in layout data file 103 are used in conjunction with technology data file 104, which are together used to define the physical layout of the semiconductor device. The physical layout includes the types of elements to be used, the number and shapes of the various layers of the semiconductor device. The preferred method has the advantage of being easily adaptable to different circuit designs and different fabrication technology. By simply changing technology files the method can be adapted from one fabrication type to another.

The control file 102 determines the types of calculations and modeling that are to be completed by the preferred method. For example, control file 102 can be used to select the particular technology file, and the particular conductor nets that are to be extracted. The control file 102 can also specify which particular process corner the circuit is to be evaluated at, such as nominal, best or worst case. Additionally, control file 102 can determine whether additional parameters, such as parasitic resistance, are to be computed. The control file 102 also typically contains default surface discretization information such as maximum element aspect ratio and maximum element size.

Thus the geometry generating method 100 uses layout data file 103, technology data file 104, and control file 102 to determine the circuit shapes of the semiconductor device, the parameters to be calculated and the relevant process corner.

A shape partititioning method 105 reshapes the circuit shapes that are to be modeled into a plurality of n-sided polygons or tiles using a geometric boolean union method. Next an extrusion method 108 creates a 3D model 109 from the tiles, where the model consists of a plurality of surfaces 110. The surfaces of conductor nets 114 and each material interface 111 consists of a plurality of surfaces 110 (See FIG. 12). Electrically connected surfaces 110 are identified using conductor net method 113 resulting in a plurality of conductor nets 114 (see FIG. 12).

Figure 4:
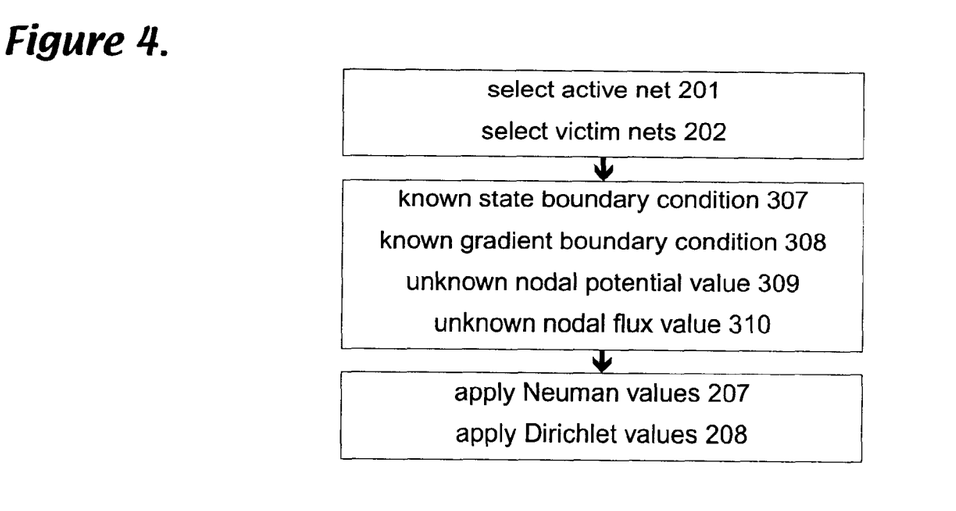
FIG. 4 is a more detailed flow chart of a boundary condition application method as identified in FIG. 2.

With reference to FIG. 4, from the set of conductor nets 114, the boundary condition application method 200 designates a single net as the active net 201 and designates other nets as victim nets 202. The boundary conditions on active net 201 and victim nets 202 comprise the Neuman boundary, while those on material interface 111 comprise the Dirichlet boundary. Next the Neuman values arc applied to the Neuman boundary 207 and the Dirichlet values to the Dirichlet boundary 208. Examples of typical Neuman and Dirichlet values include applying one volt to the active net 201, zero volts to the victim nets 202, and equal but opposite flux to both sides of the material interfaces 111.

Figure 5:
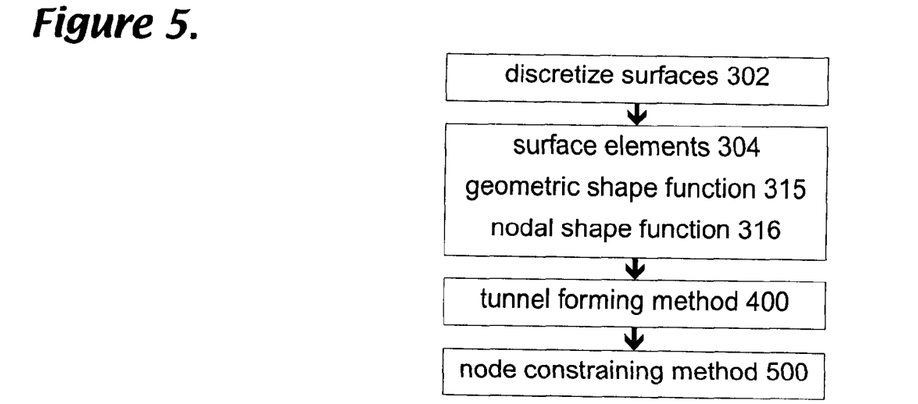
FIG. 5 is a more detailed flow chart of a discretization method as identified in FIG. 2.
Figure 13:
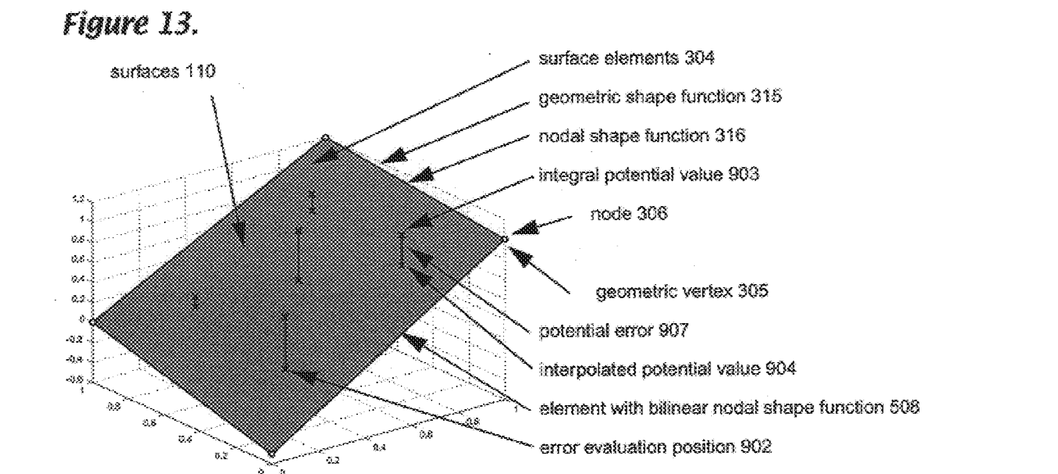
FIG. 13 shows graphically an error estimate for a discretized element formed by the difference between the integral calculation and interpolated values evaluated at selected evaluation points.
Figure 15:
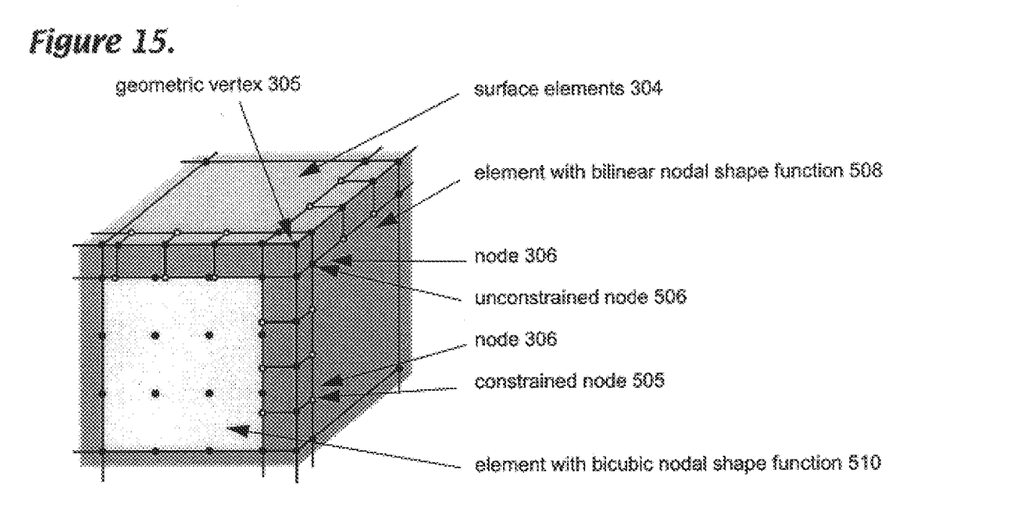
FIG. 15 shows a section of several adjacent elements with different nodal shape functions, identifying constrained nodes and unconstrained nodes.

With reference to FIG. 5, the discretization method 300 discretizes all surfaces 110 forming a plurality of surface elements 304 suitable for the field computation method 600. First, the surfaces 110 of 3D model 109 are identified, including any material interface 111. Discretize surfaces 302 forms a plurality of surface elements 304 for each surface 110 (FIGS. 13, 15). In the preferred embodiment each surface element 304 is a triangular or quadrilateral boundary element. Each surface element 304 comprises a plurality of geometric vertices 305, a geometric shape function 315, a plurality of nodes 306, and a nodal shape function 316 (FIGS. 13–15).

An arbitrary geometric location on the surface element 304 can be identified by interpolating between the geometric vertices 305 using the geometric shape function. In the preferred embodiment, the geometric shape function 315 may be a bilinear, biquadratic or bicubic polynomial. In the preferred embodiment, either a continuous or discontinuous geometric shape function 315 may be used.

Each node 306 stores a known state boundary condition 307 and known gradient boundary condition 308 and provides placeholders for an unknown nodal potential value 309 and unknown nodal flux value 310 (See FIG. 4). After an initial solution 901 is obtained (see FIG. 10), a solution value anywhere on the surface element 304 can be calculated by interpolating between the solved potential value 311 or solved flux value 312 available at each node 306 using nodal shape function 316. In the preferred embodiment, the nodal shape function 316 may be a constant, bilinear, biquadratic or bicubic polynomial. In the preferred embodiment, either a continuous or discontinuous nodal shape function 316 may be used.

Figure 6:
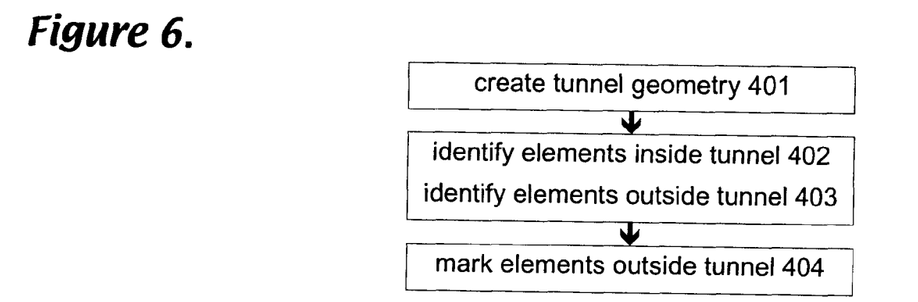
FIG. 6 is a more detailed flow chart of a tunnel forming method as identified in FIG. 5.
Figure 17:
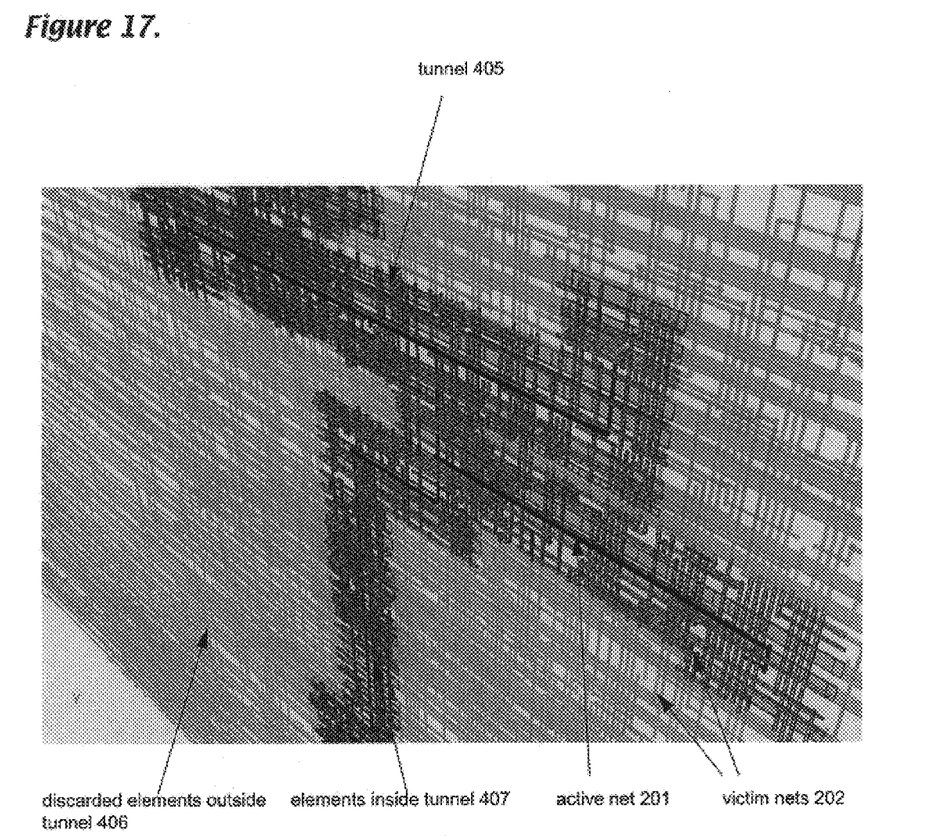
FIG. 17 is an elevational view of part of a 3D conductor structure showing a tunnel surrounding an active net and enclosing a plurality of victim nets.

An optional step is the tunnel forming method 400 which reduces the geometric complexity of the model to reduce the cpu time and memory needed for a numerical simulation. If any surface element 304 on a victim net 202 is far away from the active net 201, then it can be expected that the contribution of the surface element 304 to the external field solution 701 is very small or zero. Numerical experiments have shown that the external field solution 701 decays very rapidly, and that only geometry within a small region or tunnel 405 (FIGS. 17, 18) surrounding the active net 201 needs to be modeled to obtain an accurate estimate of the external field solution 701. FIG. 6 describes such a tunnel forming method 400. First create tunnel geometry 401 around the active net 201, where the tunnel 405 describes a limited 3D space around the active net 201. In the preferred embodiment, this tunnel 405 is created by specifying a tunnel radius and generating a tunnel surface. Then identify elements inside tunnel 402 and identify elements outside tunnel 403, and mark elements outside tunnel to be discarded 404. If a surface element 304 is located outside tunnel 405 then the geometric information associated with surface element 304 can be discarded without effecting the accuracy of the field solution. After heuristically determining a tunnel radius, the field solution on the tunnel surface should be zero (to approximate infinity). If the result is not negligible, then the tunnel radius was too small and the method is repeated with a larger tunnel 405. Numerical experiments have verified that the tunnel forming method 400 results in less than 1% errors. FIG. 17 depicts a tunnel 405 around an active net 201 with elements 407 inside the tunnel surrounded by discarded elements 406 outside the tunnel.

Figure 7:
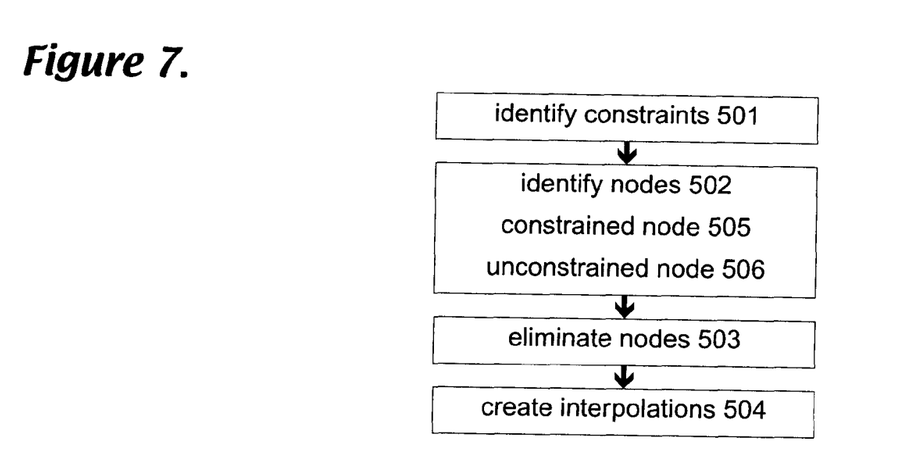
FIG. 7 is a more detailed flow chart of a node constraining method as identified in FIG. 5.
Figure 8:
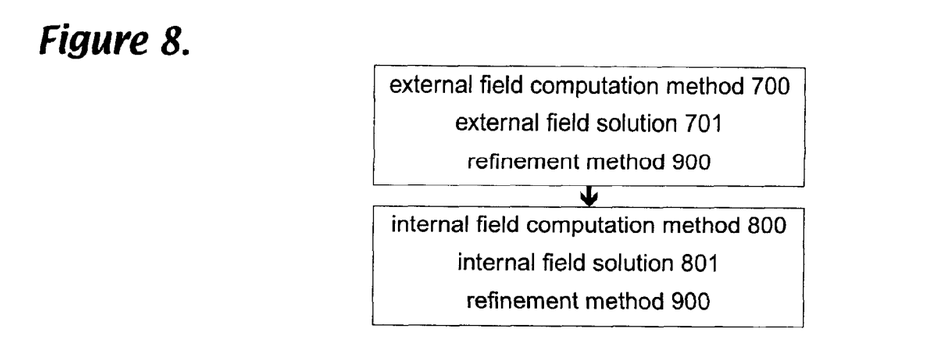
FIG. 8 is a more detailed flow chart of a field computation method as identified in FIG. 2.

Another optional step is the node constraining method 500 described in FIG. 7 which supports local element refinement by allowing for adjacent elements with mixed-order nodal shape functions. The node constraining method 500 provides the benefits of both continuous and discontinuous boundary element discretization. This allows for simple local discontinuous refinement of existing elements using arbitrary nodal shape functions 316 while still resulting in continuous nodal solutions between adjacent elements. FIG. 15 illustrates a surface element 304 with bilinear nodal shape function 508 adjacent to several surface elements 304 with assorted polynomial nodal shape functions 316, including an element with bilinear nodal shape function 508 and an element with bicubic nodal shape function 510. Even though adjacent elements may have different nodal shape functions as shown in FIG. 15, the potential nodal values and flux nodal values should be continuous. By inspection, some nodal values along shared edges can be calculated by interpolating from other nodal values. The node constraining method 500 will identify interpolation constraints 501 on the unknown nodal potential value 309 and unknown nodal flux value 310 and identify nodes 502 as either an unconstrained node 506 or constrained node 505. Note that the field solution at a constrained node can be obtained by interpolating between the field solution of unconstrained nodes, and therefore the constrained node is not a degree of freedom in the linear system and can be safely removed. For each constrained node 505, eliminate nodes 503 removes the node as a degree of freedom in the linear system and instead creates interpolations 504 using the solved potential value and solved flux value of the unconstrained nodes 506 to assign potential and flux nodal values to the constrained node 505. As a result, the degrees of freedom of the system are reduced to the number of unconstrained nodes, typically reducing the degrees of freedom by a factor of 4–6. This implies that the cpu time and memory requirements are also reduced by four to six times with no accuracy loss. With reference to FIG. 8, the field computation method 600 uses the external field computation method 700 to compute the external field solution 701 between the active net 201 and the victim nets 202 and uses the internal field computation method 800 to compute the internal field solution 801 inside the active net 201. The optional refinement method 900 alters the geometric discretization of the 3D model 109 to obtain a more accurate external field solution 701 or internal field solution 801.

Figure 9:
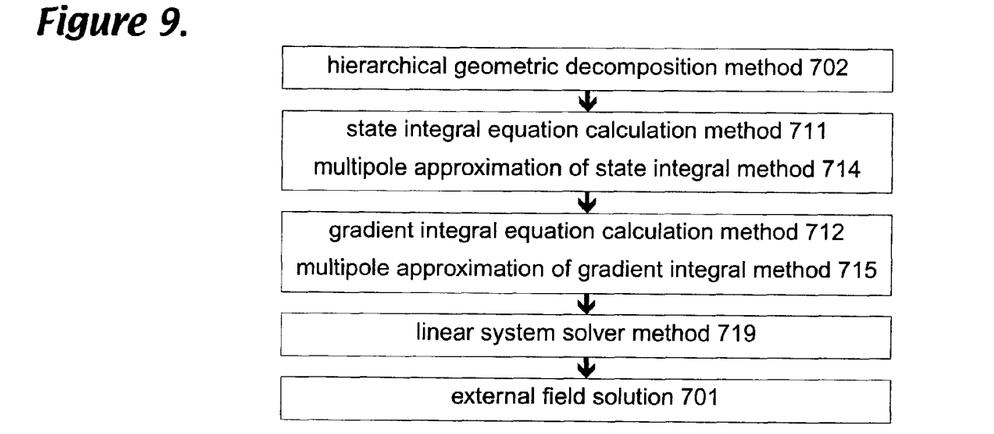
FIG. 9 is a more detailed flow chart of a external field computation method as identified in FIG. 8.

FIG. 9 describes the external field computation method 700 which computes the field response between active net 201 and victim nets 202. The boundary integral equation EQ. 1 utilizes Green's Functions to describe the effects of loadings on the entire domain. Using the divergence theorem, the boundary integral equation EQ. 1 is written in terms of double integrals on the boundary of the domain:

$$c \cdot u(i) = \int_\Gamma q(x) \cdot u^*(i, x) \cdot dx - \int_\Gamma u(x) \cdot q^*(i, x) \cdot dx \quad \text{(EQ 1)}$$

with the known state boundary condition 307 $u(x)=\bar{u}(x)$ on the Dirichlet boundary $x \in \Gamma_D$, and the known gradient boundary condition 308 $q(x)=\bar{q}(x)$ on the Neuman boundary $x \in \Gamma_N$. The first integral is called the state integral equation and the second integral is called the gradient integral equation.

The state integral equation calculation method 711 and gradient integral equation calculation method 712 require special numerical techniques since the state integral equation and the gradient integral equation are both singular or near-singular. The numerical value of the state integral equation is the state boundary integral coefficient and the numerical value of the gradient integral equation is the flux boundary integral coefficient which are computed for each surface element 304.

Each state boundary integral coefficient and flux boundary integral coefficient can be assembled into a dense potential matrix H and gradient matrix G describing the interaction of the states and gradients.

$$H \cdot \begin{bmatrix} u_0 \\ \cdots \\ u_{N-1} \end{bmatrix} = G \cdot \begin{bmatrix} q_0 \\ \cdots \\ q_{N-1} \end{bmatrix} \quad \text{(EQ 2)}$$

The known state boundary condition 307 and known gradient boundary condition 308 are inserted into the above equation resulting in a standard linear system given by EQ. 3, $$A \cdot \begin{bmatrix} x_0 \\ \cdots \\ x_{N-1} \end{bmatrix} = \begin{bmatrix} b_0 \\ \cdots \\ b_{N-1} \end{bmatrix} \quad \text{(EQ 3)}$$

which can be solved using any linear system solver method 719 to obtain the field solution 701. The field solution 701 consists of the solved potential value 311 and the solved flux value 312 on the nodes 306. In the preferred embodiment, a GMRES-style iterative linear solver is used.

The computation of the boundary integral equation EQ. 1 can be accelerated by multipole acceleration which approximates distant nodal interaction by clustering distant nodes together. This eliminates the need to compute the state integral equation calculation method 711 and gradient integral equation calculation method 712 for distant nodes. The far-field contribution by the distant clustered boundary nodes are instead computed using a multipole approximation of state integral method in EQ. 4:

$$\int_{\Gamma'} q(x) u^*(\hat{\imath}, x) dx \cong \sum_{n=0}^{p} a_n \cdot M_n(\hat{\imath} - c) \quad \text{(EQ 4)}$$

and a multipole approximation of the gradient integral method in EQ. 5:

$$\int_{\Gamma'} u(x) q^*(\hat{\imath}, x) dx \cong \sum_{n=0}^{p} b_n \cdot M_n(\hat{\imath} - c) \quad \text{(EQ 5)}$$

where $a_n$ are the state multipole coefficients, $b_n$ are the flux multipole coefficients, and $M_n$ are the multipole functions.

Figure 16A:
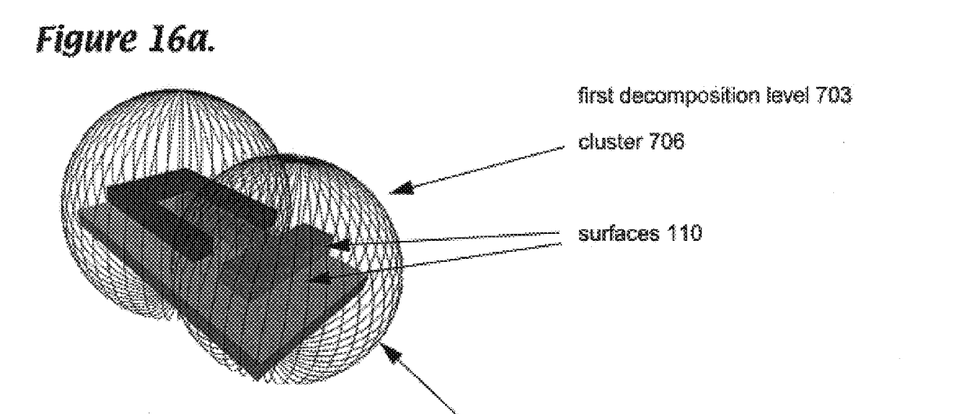
FIGS. 16A–C show graphically a hierarchical decomposition of an element discretization of the comb-finger structure of FIG. 12.

Rather than compute the active net 201 to surface element 304 interaction, the multipole approximation of state integral method 714 and multipole approximation of gradient integral method 715 allow integral evaluation by active net 201 to cluster 706 as shown in FIG. 16A. This introduces sparsity into the boundary integral equation of EQ. 1 by reducing the computational effort and cpu time required for accurate analysis and results in substantially faster computation and memory savings. Note that instead of the boundary integral equation computational scaling of $O(N^2)$ the multipole approximation of state integral method and multipole approximation of gradient integral method result in much better computational scaling of $O(N \log N)$, where N is the number of nodes.

Figure 16B:
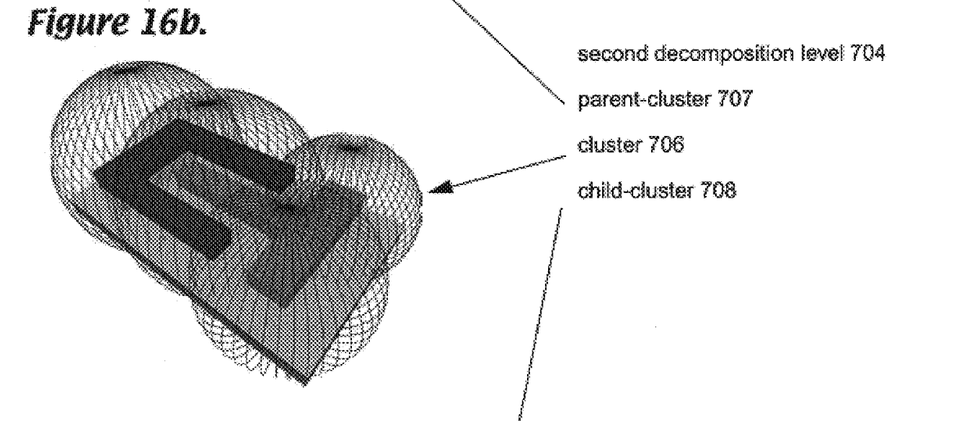
Figure 16C:
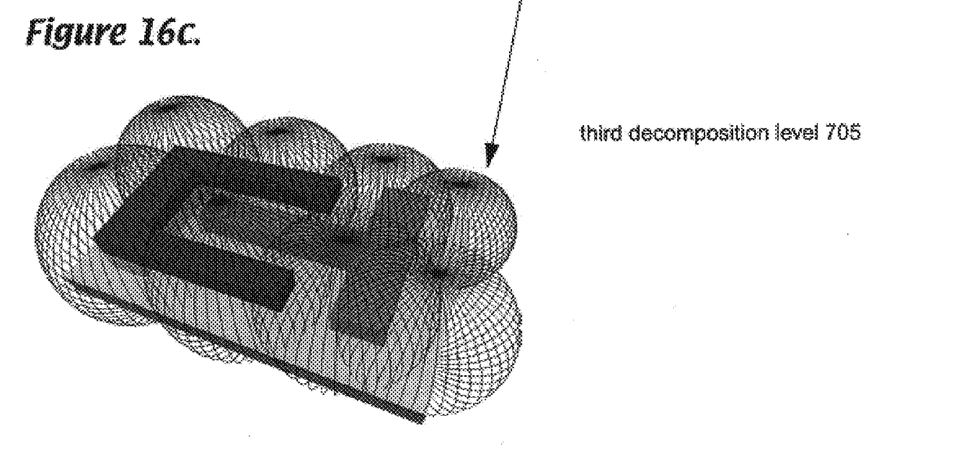

To form the multipole approximation of state integral method and multipole approximation of gradient integral method, the domain consisting of every surface element 304 is decomposed using the hierarchical geometric decomposition method 702 into a plurality of hierarchical clusters 706. FIGS. 16A–C depict first decomposition level 703, second decomposition level 704, and third decomposition level 705 respectively. The initial decomposition level which contains the entire domain is not illustrated. A multipole approximation of state integral method and multipole approximation of gradient integral method are formed for each cluster 706. The multipole coefficients of a parent-cluster 707 depend only on the multipole coefficients of child-cluster 708. In the preferred embodiment, binary bisection is used with several hundred levels of decomposition.

Figure 10:
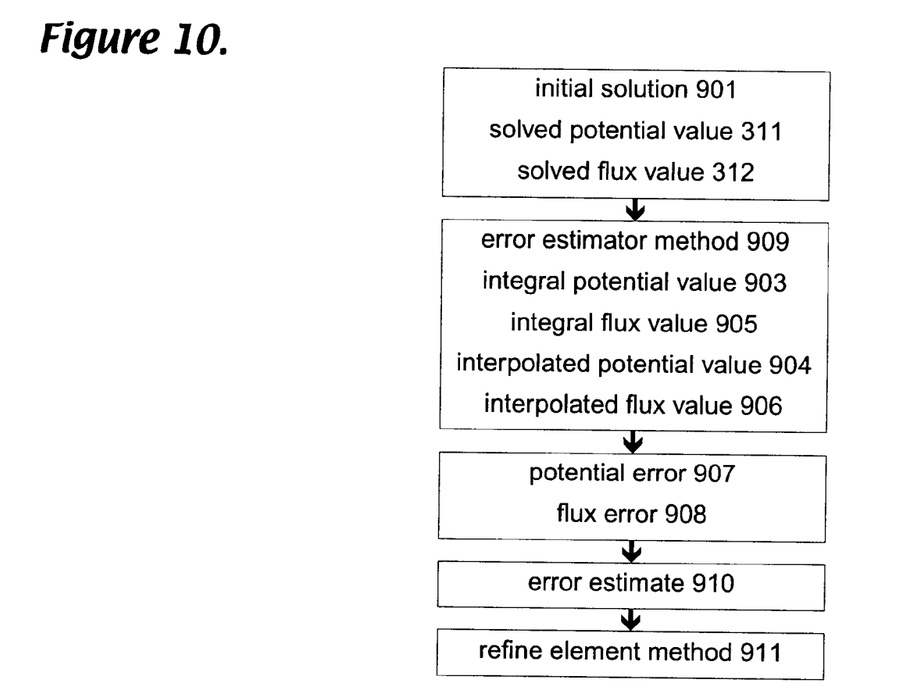
FIG. 10 is a more detailed flow chart of a refinement method as identified in FIG. 8.
Figure 12:
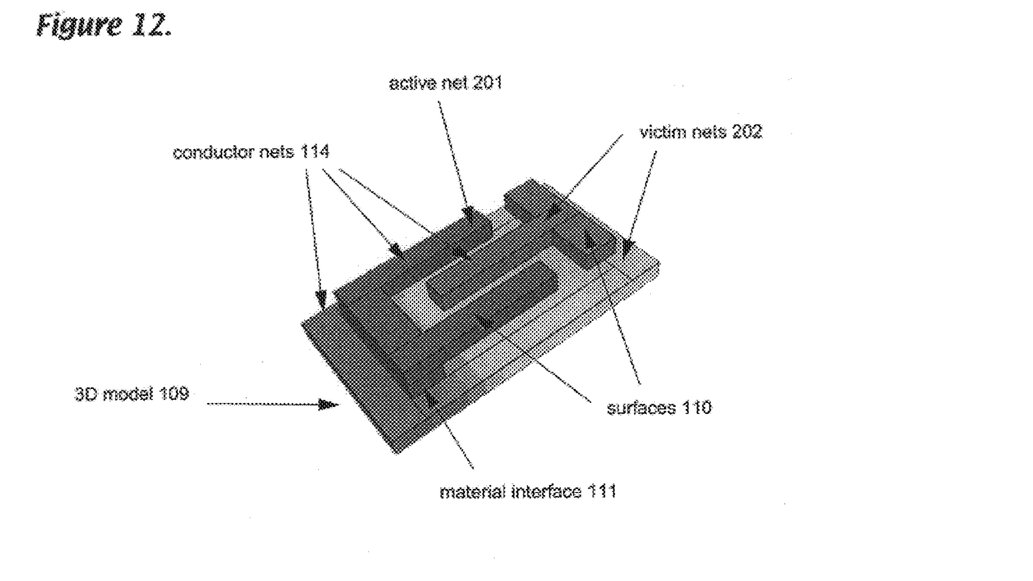
FIG. 12 shows a sample surface discretization of a 3D model of a comb-finger conductor structure.
Figure 14:
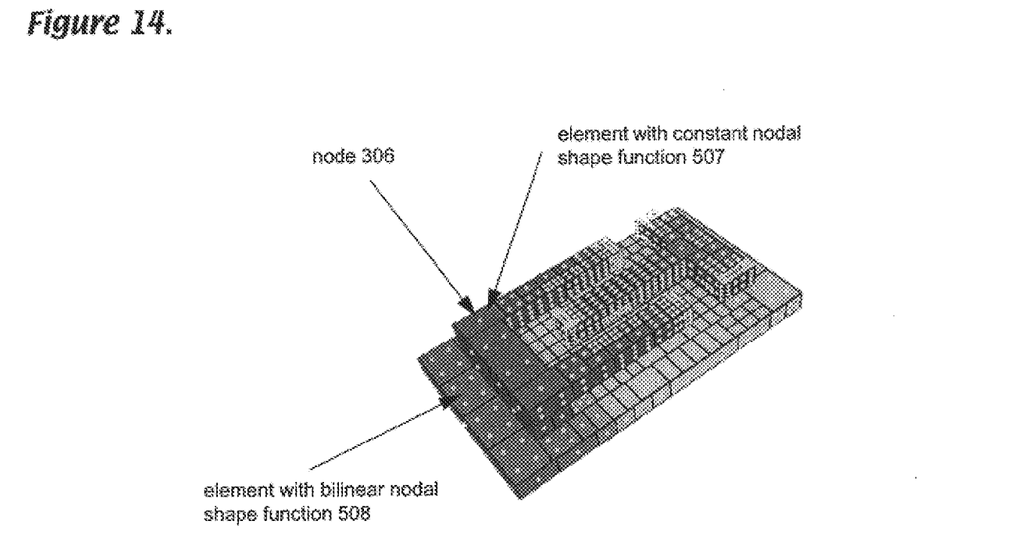
FIG. 14 shows a refined element discretization on a 3D model of the comb-finger of FIG. 12.

FIG. 10 shows the optional refinement method 900 which uses an error estimator method 909 to compute an error estimate 910 on each surface element 304. To form an error estimate 910, first solve the boundary integral equation of EQ. 1 using the initial surface discretization to obtain an initial solution 901 consisting of the solved potential values 311 and solved flux values 312 on the nodes. Then evaluate the boundary integral equation of EQ. 1 on a plurality of error evaluation positions 902 on each surface element 304 to obtain the integral potential value 903 and the integral flux value 905 for each error evaluation position 902 as shown in FIG. 13. Since the elements used nodal shape function 316, the interpolated potential value 904 and interpolated flux value 906 can be calculated at each error evaluation position 902 using interpolation between solved values at each node 306. The potential error 907 is formed as the square of the differences between the integral potential value 903 and the interpolated potential value 904 and the flux error 908 is formed as the square of the differences between the integral flux value 905 from the interpolated flux value 906. The error estimate 910 is formed by combining the potential error 907 and flux error 908 for each element. The elements with the largest errors are refined using a refine element method 911. In the preferred embodiment, the elements may be refined by reducing the size of the elements (i.e. h-refinement) or the polynomial order of the nodal shape function 316 may be increased (i.e. p-refinement). For example, FIG. 12 shows the potential result on the discretized surfaces 304 of a 3D comb-finger model 109 as shades of the gray scale. Ideally the potential error 907 and flux error 908 on the surface should be small. If they are not, then the refine element method 911 indicates that the size of the surface element 304 should be reduced (h-refinement) or that the polynomial nodal shape function 316 of the surface element 304 should be increased (p-refinement). If the error estimator method 909 shows that the elements are well-formed, then the element refinement is finished and the results are reported to the user. If some elements have a large error estimate 910, then the elements are refined until all errors are below selected user-specified limits as exemplified by the refined elements of the 3D comb-finger model depicted in FIG. 14. Note that the node constraining method 500 is ideally suited for local refinement of a selected surface element 304 without changing the discretization of adjacent elements.

Figure 18:
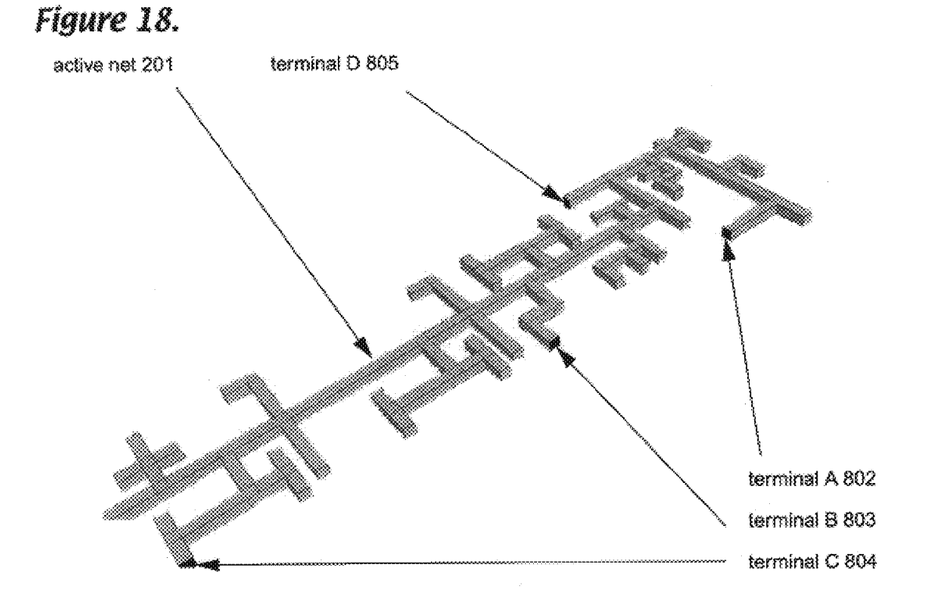
FIG. 18 is an elevational view of a 3D model of an exemplary active net with four terminals.
Figure 19:
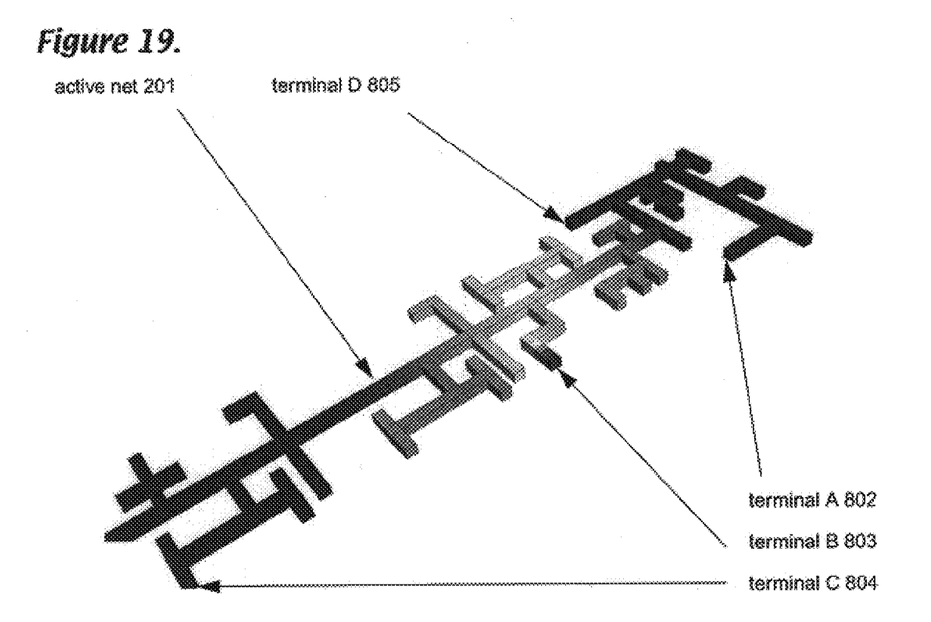
FIG. 19 is an elevational view of the active net of FIG. 18 showing graphically the solved potential drop on the active net.

Referring back to FIG. 8, the internal field computation method 800 computes the field response inside each conductor net 114. The internal field computation method 800 operates in an analogous manner to the external field computation method 700. FIG. 18 depicts a 3D model 109 of an active net 201 configured with four terminals labeled terminal A 802, terminal B 803, terminal C 804 and terminal D 805. FIG. 19 depicts an internal field solution 801 for the same 3D model 109 of the active net, where the magnitude of the potential along the net is shown as shades of the gray scale. Since current cannot leave the net, a Dirichlet boundary condition of zero flux is applied to the surfaces of the net. At each terminal a known sink or source current can be applied and the internal field computation method 800 will solve for the unknown terminal potentials and potential drop along the net. Alternatively, a known potential can be applied at the terminals, and the internal field computation method 800 will solve for the unknown terminal currents and potential drop along the wire. A further alternative is that a mixture of terminal potentials and currents can be applied at the terminals, and the unknown currents and potentials are calculated by internal field computation method 800.

Figure 11:
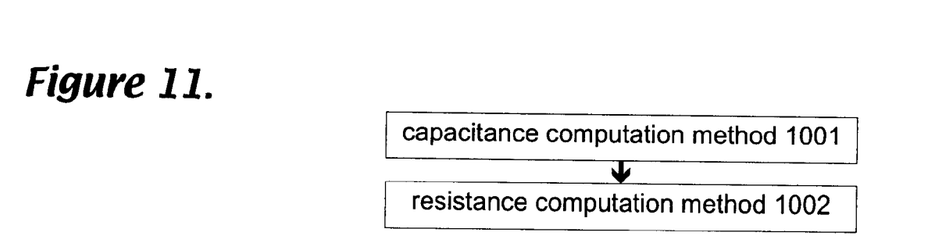
FIG. 11 is a more detailed flow chart of a parameter computation method as identified in FIG. 2.

FIG. 11 describes the parameter computation method 1000 to obtain parameters describing the interconnect or conductor, including capacitance, resistance, current density, electromigration risk, power, thermal loading etc. The capacitance computation method 1001 calculates the self-capacitance and cross-capacitances for a plurality of conductor nets 114 of the semiconductor device. The capacitance contribution of a surface element 304 is calculated by integrating over the solved node charge for the surface element 304. The self-capacitance of the active net 201 is found by summing the capacitance contributions for all surface element 304 belonging to active net 201. The cross-capacitance of active net 201 to each victim net 202 is found by summing the capacitance contributions for all surface elements 304 belonging to each victim net 202. The resistance computation method 1002 calculates the resistance for each conductor net 114 of the semiconductor interconnect or substrate. Since the internal field computation method 800 calculates the potential drop u given a known node current i (or alternatively calculates the node current i given a known potential drop u), the resistance can be calculated as $r = u/i$.

Thus described, the preferred embodiment allows an efficient and accurate method of computing the parasitic capacitance and resistance of a semiconductor device. In particular, the preferred method is adaptable to a wide range of technologies.

While the invention has been particularly shown and described with reference to a preferred exemplary embodiment thereof, it will be understood by those skilled in the art that various changes in form and details may be made therein without departing from the spirit and scope of the invention, which is defined by the claims.

What is claimed is:

1. A method of analyzing semiconductor devices, said method comprising the steps of:
   defining conductors into conductor nets;
   designating a conductor net as an active net;
   designating a plurality of conductor nets as victim nets;
   defining interfaces between disparate materials separating said conductor nets;
   discretizing the surfaces of said active net, said victim nets and said interfaces;
   computing a field response between said active net and a victim net; and calculating a selected parameter relating to the electrical behavior of said conductors from said field response.

2. A method as in claim 1 wherein said step of designating a plurality of conductor nets as victim nets comprises selecting conductors as a function of distance to said active net.

3. A method as in claim 2 wherein said step of discretizing the surfaces comprises:
   forming a three dimensional geometric representation of said conductor nets and materials, said conductor nets and materials described by a two dimensional shape file and technology file; and
   creating surface elements of said three dimensional geometric representation with a specified polynomial shape function.

4. A method as in claim 3 wherein said step of discretizing elements comprises:
   identifying nodes on elements which are constrained by surrounding nodes;
   increasing the polynomial order of identified elements or refining discretization of identified elements without effecting discretization of adjacent elements.

5. A method as in claim 1 wherein said step of computing a field response comprises computing a state field response and gradient field response between at least one active net and at least one victim net.

6. A method as in claim 5 wherein said step of computing said field responses comprises:
   calculating error of field responses on each element;
   identifying elements with large errors; and
   increasing the polynomial order of identified elements or refining discretization of identified elements.

7. A method as in claim 5 wherein said step of computing a state field response and gradient field response comprises:
   solving a first integral equation that describes said state field response;
   solving a second integral equation that describes said gradient field response;
   specifying a known state or gradient boundary condition on each said surface; and
   solving for the unknown state or gradient value for each said surface.

8. A method as in claim 7 wherein said step of solving said integral equations comprises:
   approximating said state integral equation with a first multipole expansion; and
   approximating said gradient integral equation with a second multipole expansion.

9. A method as in claim 8 wherein said multipole expansions are obtained in a hierarchical manner, where each parent multipole expansion is formed from children multipole expansions.

10. A method as in claim 2 wherein said parameters include at least one parameter from the group:
    potential, current density, current, resistance, and capacitance.

11. A computer system for analyzing semiconductor devices, said computer system comprising:
    means for defining conductors into conductor nets;
    means for defining interfaces between disparate materials separating said conductor nets;
    means for designating a conductor net as an active net;
    means for designating a plurality of conductor nets as victim nets;
    means for discretizing the surfaces of said active net and said victim nets;
    means for computing a field response between said active net and a victim net;
    and means for calculating a selected parameter relating to the electrical behavior of said conductors from said field response.

12. A computer program residing on a computer readable medium for causing, a computer to analyze semiconductor devices having conductors, comprising computer executable instructions for:
    defining conductors into conductor nets;
    defining interfaces between disparate materials separating said conductor nets;
    designating a conductor net as an active net;
    designating a plurality of conductor nets as victim nets;
    discretizing the surfaces of said active net and said victim nets;
    computing a field response between said active net and a victim net; and
    calculating a selected parameter relating to the electrical behavior of said conductors from said field response.

* * * * *